(12) United States Patent
Salsman et al.

(10) Patent No.: US 7,280,078 B2
(45) Date of Patent: Oct. 9, 2007

(54) SENSOR FOR DETECTING HIGH FREQUENCY SIGNALS

(75) Inventors: Kenneth E. Salsman, Pleasanton, CA (US); Daniel W. So, Palo Alto, CA (US)

(73) Assignee: Scenterra, Inc., Bowie, MD (US)

( * ) Notice: Subject to any disclaimer, the term of this patent is extended or adjusted under 35 U.S.C. 154(b) by 0 days.

(21) Appl. No.: 11/157,272

(22) Filed: Jun. 20, 2005

(65) Prior Publication Data

US 2006/0284774 A1   Dec. 21, 2006

Related U.S. Application Data

(60) Provisional application No. 60/522,921, filed on Nov. 20, 2004, provisional application No. 60/522,922, filed on Nov. 20, 2004, provisional application No. 60/522,923, filed on Nov. 20, 2004, provisional application No. 60/522,924, filed on Nov. 20, 2004, provisional application No. 60/522,925, filed on Nov. 20, 2004.

(51) Int. Cl.
*G01R 29/10* (2006.01)

(52) U.S. Cl. .................. 343/703; 73/579; 436/164

(58) Field of Classification Search ............... 343/703, 343/701, 700 MS; 374/121, 244; 324/244; 73/579, 23.31; 436/164
See application file for complete search history.

(56) References Cited

U.S. PATENT DOCUMENTS

| | | | |
|---|---|---|---|
| 4,348,681 A | 9/1982 | McVeigh et al. | |
| 4,665,363 A * | 5/1987 | Extance et al. | 324/244.1 |
| 5,018,865 A | 5/1991 | Ferrell et al. | |
| 5,073,782 A * | 12/1991 | Huguenin et al. | 342/179 |
| 5,445,008 A | 8/1995 | Wachter et al. | |
| 5,483,338 A | 1/1996 | Wachter et al. | |
| 5,719,324 A | 2/1998 | Thundat et al. | |
| 5,745,437 A | 4/1998 | Wachter et al. | |
| 5,756,895 A | 5/1998 | Kubena et al. | |
| 5,829,448 A | 11/1998 | Fisher et al. | |
| 5,832,931 A | 11/1998 | Wachter et al. | |
| 5,889,490 A | 3/1999 | Wachter et al. | |
| 5,905,202 A | 5/1999 | Kubena et al. | |
| 5,918,263 A | 6/1999 | Thundat | |
| 5,998,597 A | 12/1999 | Fisher et al. | |
| 6,005,400 A | 12/1999 | Thundat et al. | |
| 6,016,686 A | 1/2000 | Thundat | |
| 6,042,603 A | 3/2000 | Fisher et al. | |
| 6,050,722 A | 4/2000 | Thundat et al. | |
| 6,096,559 A | 8/2000 | Thundat et al. | |
| 6,109,105 A | 8/2000 | Kubena et al. | |
| 6,118,124 A | 9/2000 | Thundat et al. | |
| 6,167,748 B1 | 1/2001 | Britton, Jr. et al. | |
| 6,212,939 B1 | 4/2001 | Thundat | |
| 6,263,734 B1 | 7/2001 | Fujii et al. | |
| 6,263,736 B1 | 7/2001 | Thundat et al. | |
| 6,289,717 B1 | 9/2001 | Thundat et al. | |
| 6,311,549 B1 | 11/2001 | Thundat et al. | |
| 6,311,557 B1 | 11/2001 | Davis et al. | |
| 6,325,904 B1 | 12/2001 | Peeters | |
| 6,330,824 B1 | 12/2001 | Erie et al. | |

(Continued)

*Primary Examiner*—Hoanganh Le
(74) *Attorney, Agent, or Firm*—Matthew J. Esserman

(57) ABSTRACT

A sensor that senses incident RF signals is provided. The sensor is capable of sensing signals in the Gigahertz (GHz) and Terahertz (THz) range. The sensor may utilize one or more cantilevers, an interferometer, or may be formed in a box-type configuration.

42 Claims, 10 Drawing Sheets

U.S. PATENT DOCUMENTS

| | | |
|---|---|---|
| 6,331,286 B1 | 12/2001 | Dees et al. |
| 6,336,366 B1 | 1/2002 | Thundat et al. |
| 6,433,543 B1 * | 8/2002 | Shahinpoor et al. ..... 324/244.1 |
| 6,436,346 B1 | 8/2002 | Doktycz et al. |
| 6,444,972 B1 | 9/2002 | Datskos et al. |
| 6,519,076 B2 | 2/2003 | Fisher et al. |
| 6,525,862 B2 | 2/2003 | Fisher et al. |
| 6,545,495 B2 | 4/2003 | Warmack et al. |
| 6,545,785 B1 | 4/2003 | Heflinger et al. |
| 6,552,339 B1 | 4/2003 | Gupta et al. |
| 6,646,275 B2 | 11/2003 | Oae et al. |
| 6,650,319 B1 | 11/2003 | Hurst et al. |
| 6,716,638 B1 | 4/2004 | Hsiung |
| 6,737,648 B2 | 5/2004 | Fedder et al. |
| 6,763,705 B1 | 7/2004 | Thundat et al. |
| 6,770,882 B2 | 8/2004 | Carr et al. |
| 6,805,839 B2 | 10/2004 | Cunningham et al. |
| 6,831,747 B2 | 12/2004 | Ferrell et al. |
| 6,851,297 B2 | 2/2005 | Cunningham et al. |
| 6,860,939 B2 | 3/2005 | Hartzell |
| 6,864,692 B1 | 3/2005 | Patel et al. |
| 6,933,164 B2 | 8/2005 | Kubena |
| 7,109,730 B2 * | 9/2006 | Slupsky ...................... 324/753 |
| 7,125,451 B2 | 10/2006 | Hartzell |
| 7,128,783 B2 | 10/2006 | Hartzell |
| 7,135,070 B2 | 11/2006 | Hartzell |
| 7,156,916 B2 | 1/2007 | Hartzell |
| 2003/0011285 A1 | 1/2003 | Ossman |
| 2003/0196591 A1 | 10/2003 | Hartzell |
| 2005/0130360 A1 | 6/2005 | Zhan et al. |
| 2005/0162040 A1 | 7/2005 | Robert |
| 2006/0051884 A1 | 3/2006 | McNamara et al. |
| 2006/0238239 A1 | 10/2006 | Zalalutdinov et al. |

* cited by examiner

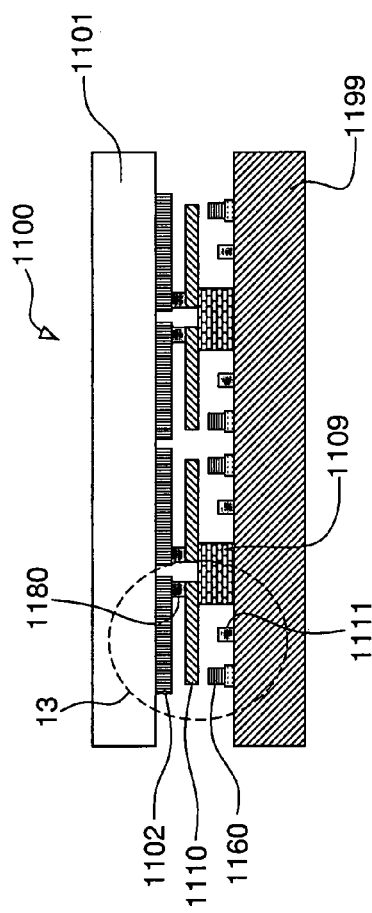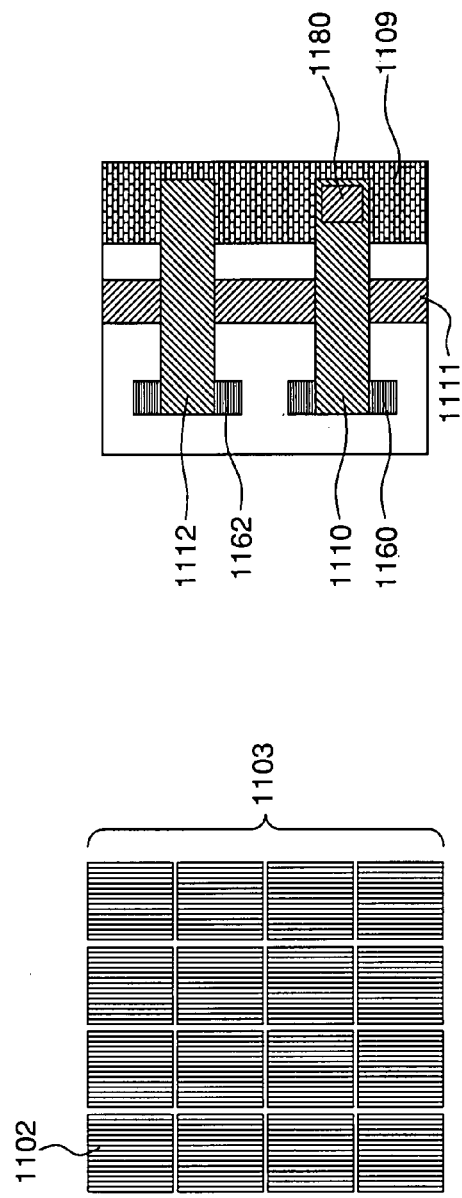

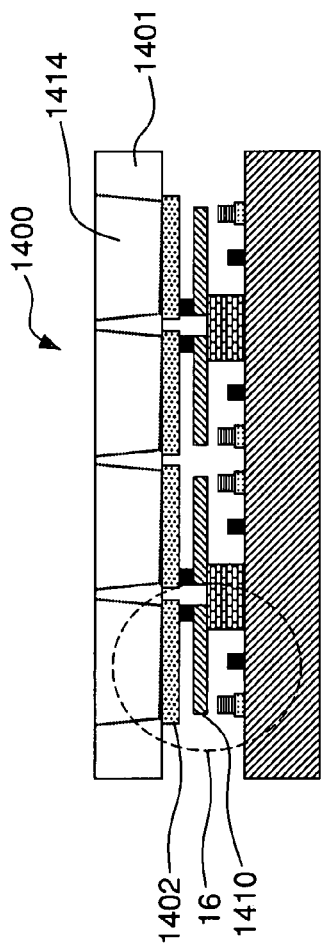
FIG. 14
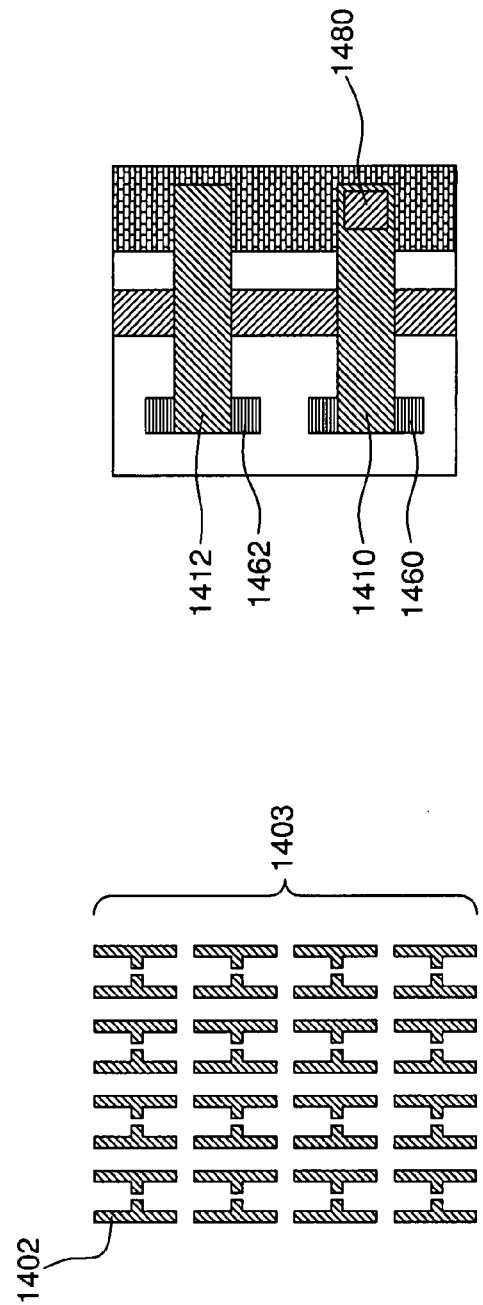
FIG. 16
FIG. 15

SENSOR FOR DETECTING HIGH FREQUENCY SIGNALS

This application claims priority from provisional application No. 60/522,921, filed Nov. 20, 2004, provisional application No. 60/522,922, filed Nov. 20, 2004, provisional application No. 60/522,923, filed Nov. 20, 2004, provisional application No. 60/522,924, filed Nov. 20, 2004, and provisional application No. 60/522,925, filed Nov. 20, 2004.

FIELD OF THE INVENTION

The present invention is a device, or family of devices, designed for sensing RF signals, and more particularly for sensing RF signals in the gigahertz and terahertz regions.

BACKGROUND OF THE INVENTION

The Gigahertz (GHz) and Terahertz (THz) regions of the microwave spectrum have been identified as an area where macro molecule resonances may be detected without destructive ionization of the original molecules. Of particular interest is the ability to measure the molecular vibration of large molecules in applications ranging from medical sensing to bio-terrorism warning sensors. Detection schemes for sensing these regions have primarily relied on the induction of a thermal change in extremely sensitive bolometers. These devices respond to a received signal by converting RE energy into a thermal change in the bolometer element, that which in turn generates stress. This stress may be measured by detecting a static change in the capacitance shift as the element moves relative to a sensing electrode. Advanced bolometers are used in astronomy and other applications that utilize hot electrons, in superconducting materials. While these systems are extremely sensitive, they are also extremely expensive and require a significant infrastructure of equipment to operate them. These approaches either provide a narrow frequency response per element and requite an array of narrow responses with each element in the array having a slightly different response region, or provide magnitude data (but not frequency measurements) within their receiving bandwidth.

Therefore a need exists for a sensor capable of working with broadband emitters and able to provide frequency mapping of the received signals, thereby simplifying the electronics required for spectral analysis. Further, a device designed to have a variety of sensitivities or gains to be used in a wide variety of environments and applications is also needed.

BRIEF SUMMARY OF THE INVENTION

A sensor that senses incident RF radiation, the sensor comprising: an antenna suitable for receiving the incident RF radiation; a cantilever electrically coupled to the antenna, wherein the cantilever is affected by the received incident RF radiation; a converter for converting the effect on the cantilever into a measurable signal indicative of the received incident RF radiation; and a detector for sensing the measurable signal, wherein the detected sensed measurable signal indicates the received incident RF radiation. Alternatively, a box-type structure or interferometer may be employed in place of the cantilever. The sensor is capable of sensing RF signals in the GHz and THz regions.

BRIEF DESCRIPTION OF THE SEVERAL VIEWS OF THE DRAWINGS

Understanding of the present invention will be facilitated by consideration of the following detailed description of the preferred embodiments of the present invention taken in conjunction with the accompanying drawings, in which like numerals refer to like parts and in which:

FIG. 11 illustrates a photoelectric MEMS array sensor according to an aspect of the present invention;

FIG. 12 illustrates a plan view of the photoelectric pixel array used in FIG. 11 according to an aspect of the present invention;

FIG. 13 illustrates an enlarged plan view of the selected portion 13 in FIG. 11 (i.e. with the pixel array substrate and photoelectric pixel removed for simplicity purposes) according to an aspect of the present invention;

FIG. 14 illustrates an RF MEMS array sensor according to an aspect of the present invention;

FIG. 15 illustrates a plan view of the RF antenna pixel array used in FIG. 14 according to an aspect of the present invention; and FIG. 16 illustrates an enlarged plan view of the selected portion 16 in FIG. 14 (i.e. with the pixel array substrate and RF antenna pixel removed for simplicity purposes) according to an aspect of the present invention.

DETAILED DESCRIPTION OF THE INVENTION

Figure 1:
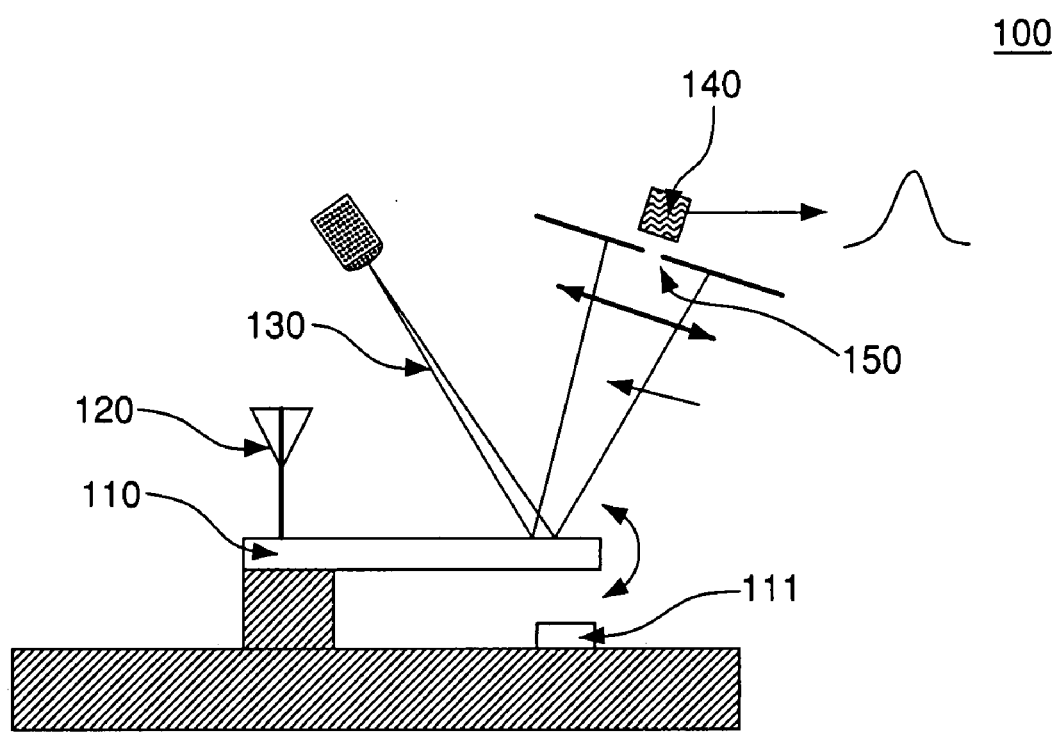
FIG. 1 illustrates a sensor for sensing an RF signal according to an aspect of the present invention.

It is to be understood that the figures and descriptions of the present invention have been simplified to illustrate elements that are relevant for a clear understanding of the present invention, while eliminating, for the purpose of clarity, many other elements found in typical sensing device. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

The present invention may provide a sensor capable of working with broadband emitters and may be able to provide frequency mapping of the received signals, thereby simplifying the electronics required for spectral analysis. Further, the device of the present invention may be designed to have a variety of sensitivities or gains to be used in a wide variety of environments and applications.

A mechanically controllable membrane, such as a microelectromechanical system (MEMS) for example, may be used. MEMS are typically integrated micro devices or systems combining electrical and mechanical components, fabricated using integrated circuit processing techniques and may range in size from nanometers to millimeters, These systems may sense, control and actuate on the micro scale, and may function individually or in arrays to generate effects on the macro scale. The use of MEMS is known to those possessing an ordinary skill in the pertinent arts, In brief, a MEMS may include a base and a deflector. The base and deflector may be made from materials as is known to those possessing an ordinary skill in the pertinent arts, such as for example, InP, GaAs, SiN, Si, or SiO2, The MEMS may operate wherein an application of energy to the MEMS causes a longitudinal deflection of the deflector with respect to the base. The longitudinal displacement of the deflector from the base is proportional to the energy applied to the MEMS. A wide variety of MEMS structures may be applicable to this sensing technique. While only a few select varieties of structures are described in detail herein, other structures, such as rocking arms and flexible diaphragms, for example, as would be known to those having an ordinary skill in the pertinent arts, may be designed to vary oscillation based upon the charge differential imposed on a conductive element by a received RE signal. MEMS can be integrated into devices which have mechanical advantages and therefore can increase detection of signal. In addition, it may be possible to utilize a MEMS and reference comparison without generating an oscillation in the MEMS. However, such an approach may be more sensitive to long scale thennal or other environmental changes, and may require recalibration periodically to provide an accurate and sensitive measurement. In a static configuration, magnetic fields may be used instead of electrical fields, eliminating the need for a drive or reference field generator.

The device of the present invention may be fabricated on a variety of materials, including silicon. The size of the elements may be variable so that this type of detector may be fabricated for use over wide frequency ranges with particular central frequencies. By incorporating a reference and by using an oscillation frequency, this invention may be capable of both detecting the signal and measuring its frequency. In addition, the sensitivity of the sensor described herein may be enhanced by the elimination of ambient noise generators that may affect traditional sensing techniques for identifying the position of the MEMS. By creating a baseline oscillation in the sensor and utilizing a reference element, the affects of temperature, humidity, vibration and other environmental affects that may impact the sensitivity of the receiver may be eliminated. In addition, the gain of this MEMS sensor may be increased by changing the length, or resonance frequency, of the MEMS structures. Designing the MEMS to resonate at a specific RF frequency may also increase the sensitivity of this receiver, especially at that frequency. The sensitivity of this sensor may be enhanced by the elimination of ambient noise generators that would affect a traditional inductance or capacitance detector. By creating a baseline oscillation, such as, for example, in a two element sensor, and utilizing one of the elements as a reference, ambient affects, such as temperature, humidity, vibration, and other environmental affects, may be eliminated or reduced.

According to an aspect of the present invention, two substantially identical MEMS may be used. Each MEMS may be conflgru-ed as a cantilever, to thereby sense the magnitude and frequency of a received RE signal, such as in the 0Hz and THz region, for example. In such a configuration, a first MEMS may be a reference and a second MEMS may be the signal receiving element. A driven oscillation may be used to generate a known frequency within the MEMS. Upon receiving an incident signal, the second MEMS may be affected by a change in the charge and a corresponding change in the oscillation while the first MEMS remains isolated from the incoming signal. The variation in oscillation of the second MEMS may change the field interaction with a detection electrode that senses the position of the MEMS, such as by induction, capacitance, electron tunneling, piezoelectric stress, and interference, for example. The signal from the electrode correspondent corresppnding to the second MEMS may then be compared to the signal from the reference MEMS electrode, which may remain in stable oscillation. Such a comparator may subtract these signals to provide an output signal corresponding to the incoming signal.

When the incoming signal matches the frequency of oscillation of the MEMS, the output signal may be a change in the magnitude of the receiving element. When the incoming signal is a different frequency than the oscillation frequency, the combined signal may be the beat frequency between the oscillation frequency and the incoming signal frequency, This beat frequency may be converted to the natural resonance frequency of the MEMS element since the oscillation frequency is known. The beat frequency equals the received frequency minus the generated frequency. If no oscillation frequency is used, the incoming signal may he directly read, albeit with additional environmental effects. As may be realized by those possessing an ordinary skill in the pertinent arts, when calculating signal values, and an increase in the accuracy of the calculation may result from the use of multiple measurements in the calculation. In this regard, to increase the accuracy of these measurements, another pair of MEMS may be used to provide another set of data points and driven at an offset oscillation frequency. The resulting signal may represent two different beat frequency patterns that may be convened to the frequency of the incoming signal, and each output signal may be used to refine the conversion to the frequency of the incoming signal. Additional pairs of MEMS may also be used to further refine the measurements described hereinabove.

The present invention may also provide for a highly sensitive detector that is capable of being fabricated in high volume and at low cost for use in GHz and THz sensor products, such as bio-threat and chemical sensors. The present invention may provide the ability to up-convert the RF signal incident on an array into an optical image capable of being captured on a photo-sensor or an imaging array, such as a CCD, for example.

Referring now to FIG. 1, there is shown a sensor for sensing RF signals according to an aspect of the present invention. Sensor 100 may include a MEMS 110, an antenna 120, a source emitting a beam 130, a detector 140, and an aperture 150. As may be seen in FIG. 1, MEMS 110 may be coupled to antenna 120 such that signals incident on anterma 120 are coupled to MEMS 110 to effect the position of the cantilever of MEMS 110. MEMS can be incorporated into the antenna structure such that the charge on the MEMS varies as the antenna resonates. Alternatively, the MEMS device is connected to the antenna, but can be positioned below the antenna structure (i.e. not an inherent part of the antenna itself - see FIG. 14 which is explained below). In this configuration, the MEMS changes its charge as the antenna resonates and sends charge down into the circuit. The MEMS is therefore part of the capacitive value of the antenna system, but it is not part of the dipole member. Another alternative technique is to include the MEMS device as part of a waveguide. The MEMS doesn't oscillate at THz frequency. Rather, the resonated charge is actually a charge built up on the MEMS device and thus, the MEMS integrates over time. By adding a reference signal, a beat frequency is obtained which is another way of performing the integration. Thus, like a switch, once the electrons build up on the end of the MEMS device, it deflects towards the correct field strength and that deflection is measured.

Beam 130 may be directed onto the surface of MEMS 110 such that as MEMS 110 is affected by incident signals, beam 130 deviates responsive thereto. More specifically, as MEMS 110 is affected by the incoming signal, the electrical characteristics of MEMS 110 may change. As the electrical characteristics vary MEMS 110, fixed at a. first end, changes the angle at a second end free to move as a cantilever, as shown. This second end of the MEMS may move relative to a base 111. The electrical characteristics of MEMS 110 affect the degree of deflection or frequency of oscillation of the free end of MEMS 110. As this effect occurs the distance between the second end of MEMS 110 and base 111 changes. This variation m distance effects the incident and exit angle of incident beam 130 by causing a shift in each. This shift may result in a displacement of beam 130 downstream. Detector 140 may be positioned such that deviations in beam 13 Oj may be monitored at detector 140. Further, aperture 150 may be positioned near to detector 140 in a position to limit beam 130 as would be evident to those possessing an ordinary skill in the pertinent arts. Briefly, a Gaussian beam, for example, may have a beam profile that moves across the detector based on the angle of the second end of MEMS 110. As this beam traverses the detector, a beam stop may be used to control the available incident angle of detectable beams. As an incoming signal reaches antenna 120, the effect of the signal is coupled to MEMS 110, which in turn affects the angle of incidence and exit of beam 130, which is detected at detector 140. This detection at detector 140 corresponds to the incoming signal by having a different signal detected for each position of the second end of MEMS 110, which is related to the electrical characteristic of the signal on MEMS 110. As may be evident to those possessing an ordinary skill in the pertinent arts, if beam 130 is Gaussian, for example, a shift in beam 130 on aperture 150 may cause a decrease in the signal on detector 140 according to known slit/Gaussian properties.

As the potential of MEMS 110 changes, the charge differential between MEMS 110 and the common electrode 111 may vary causing MEMS 110 to change its spacing or position relative to the common electrode. In the case where the element is oscillated at a known frequency, the incoming charge from the received RF signal may change the oscillation frequency of the MEMS 110.

According to an aspect of the present invention, a reflective MEMS 110 may be designed to move so that the movement changes the angle of incidence beam 130. Such changes in MEMS 110 may be responsive to an applied external electrical field resulting from receipt of an electromagnetic wave of the proper wavelength region. MEMS 110 may be deflected due to its proximity to a common electrode that provides a static or known oscillating field on the element. As the potential of the MEMS changes, a charge differential between the element and the common electrode may vary, which may cause the MEMS to change its spacing or position relative to the common electrode. According to an aspect of the present invention, MEMS 110 may be oscillated at a known frequency such that the incoming charge from the received RF signal may change the oscillation frequency of MEMS 110.

An optical beam 130 from a laser or other source, such as a parallel beam of light, a Gaussian or other known variable intensity energy pattern across the beam diameter, for example, may be used to illuminate MEMS 110. Beam 130 may be designed to diverge in angle, thereby creating a larger diameter spot size at photo-sensor 140. Sensor 140 may be designed to measure the intensity of beam 130 at one point with a well-defined beam diameter. For a static system, the incoming RF signal may change the measured beam intensity as MEMS 110 is deflected. For an oscillating system, the frequency of the beam intensity measured by sensor 140 may change as the charge imposed by the incoming RE signal changes the oscillation pattern of MEMS 110.

As may be evident to those possessing an ordinary skill in the pertinent art, the sensitivity or gain of such a configuration may be manipulated by varying the parameters of the beam, such as the diameter of the beam at the photo-sensor or the intensity pattern of the beam, varying the deflection sensitivity of the MEMS, changing the geometry of the system, such as by varying the distance between the MEMS and the photo-sensor, or by changing the responsive characteristics of the system, such as by varying the frequency of the light used and the photo-sensors sensitivity to that frequency.

A variation of the sensitivity or gain of a system according to the present invention may be achieved a number of ways, such as by varying the interference mode at the photo-sensor, varying the electro-mechanical deflection sensitivity of the MEMS, changing the path length difference between the MEMS and the photo-sensor, and varying the frequency of the light used and the photo-sensor's sensitivity at that frequency, for example.

Variances on this design may include a magnetic version of a MEMS, and as the charge on the MEMS varies, the deflection in the magnetic field may perform the same function as in the electrical field version described herein above. Such a magnetic version may be advantageous because such a configuration may not need electrical power to operate and may provide THz sensing in remote areas where power is not available or not wanted.

Figure 2:
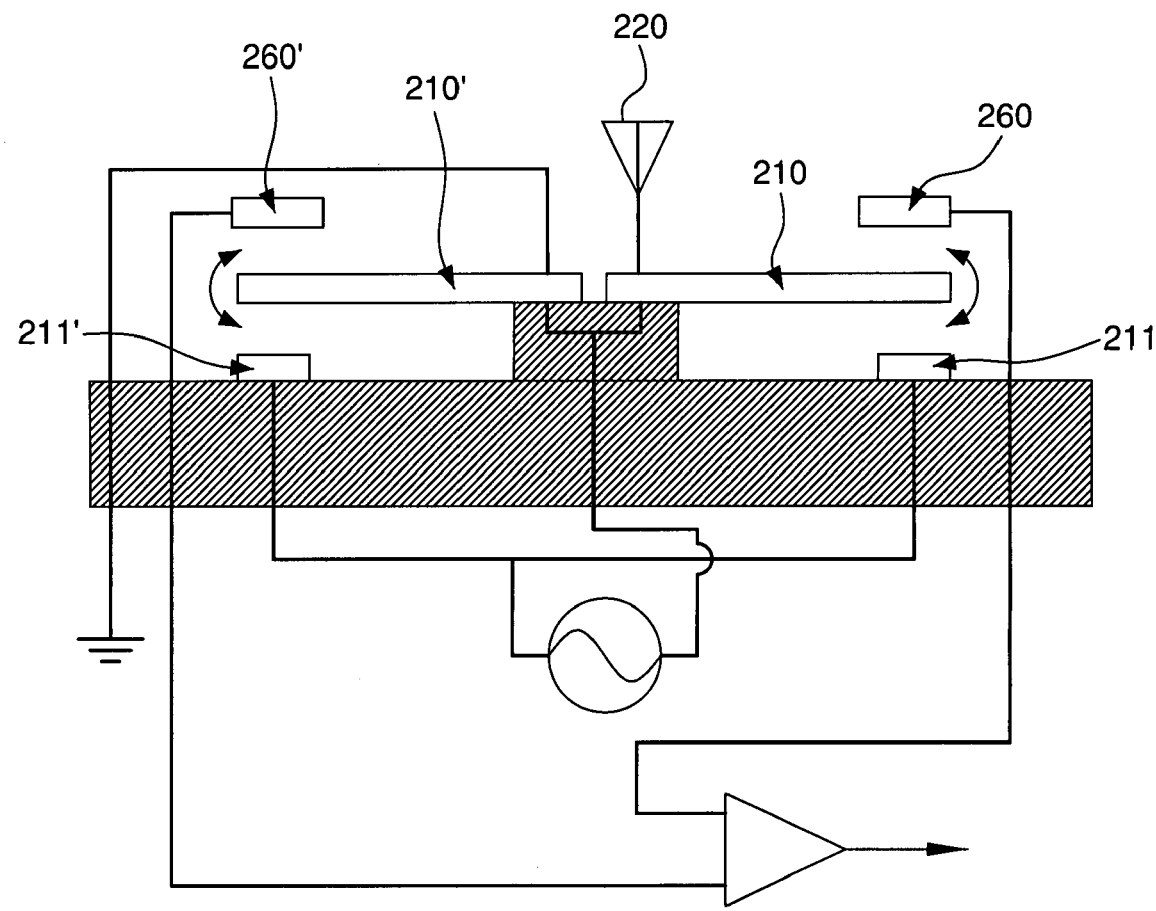
FIG. 2 illustrates a variation of the present invention wherein a reference is added to the device of FIG. 1.

Referring now to FIG. 2, there is shown an embodiment of the present invention wherein a second detection device is added as a reference creating a duplicate to the device of FIG. 1. As shown in FIG. 2, the present invention may also include the use of two, or multiple, MEMS 210, 210'. In such a configuration, hail first MEMS 210' may act as a reference, and both MEMS 210, 210' may be oscillated to provide a method of elimination for environmental noises.

As discussed with respect to FIG. 1, MEMS 210 may interact with a signal 220. A second end of MEMS 210 may deflect with respect to base 211 in response to the signal 220. Additionally a second MEMS 210' isolated from the incoming signal may react to ambient or environmental conditions. The reaction MEMS 210 has to the signal may include such reaction to ambient or environmental conditions. By measuring the reaction with MEMS 210'. an accounting for these noise signals to rngy be made. This noise may cause MEMS 210' to react and second end of 210' to deviate with respect to 211' as discussed hereinabove. This detection may be measured and equated to noise. Since base 211 and base 211' are equated, the noise on each channel 210, 210' may be equated. By accounting for the noise on channel 210 measurements of signal 220 can be wade more accurate.

The present invention may include MEMS 210 operating in a magnetic field, as opposed to the electric field described above, such that as the charge on MEMS 210 varies, MEMS 210 may deflect in the magnetic field as discussed hereinabove. While principally operating the same as an electrical field device, a magnetic version may not need electrical power and may provide sensing in areas where providing power is an issue, where it may be difficult to deliver power, or where a power source may be unwanted, such as in remote areas or areas where such power may be negatively detected.

As described herein, detection of the induction of a charge differential on MEMS 210 may in turn be deflected relative to a common electrode 211, 211'. The movement of MEMS 210 may be measured by the inclusion of beam 130 that is deflected by MEMS 210 to receiving photo sensor 140. The deflection of beam 130 may provide an extremely accurate measurement of the position of MEMS 210 and thereby detecting the RF inducted signal. To identify and quantify this signal the motion of the detection element may be compared against another identical element that is isolated from the signal and serves as a reference. This approach greatly increases the sensitivity of the detector and reduces the affects of noise from ambient sources. Beat frequency analysis of the oscillation provides the ability to identify the frequency of the received signal.

Instead of relying on measuring the deflection of MEMS 210, 210' by use of an external beam 130, an electrical measurement may be made using a probe 260. The electrical signal on probe 260 being effeeted affected by the position of the second end of MEMS 210 and the signal on probe 260' being effected by the position of the second end of MEMS 210'.

Figure 3:
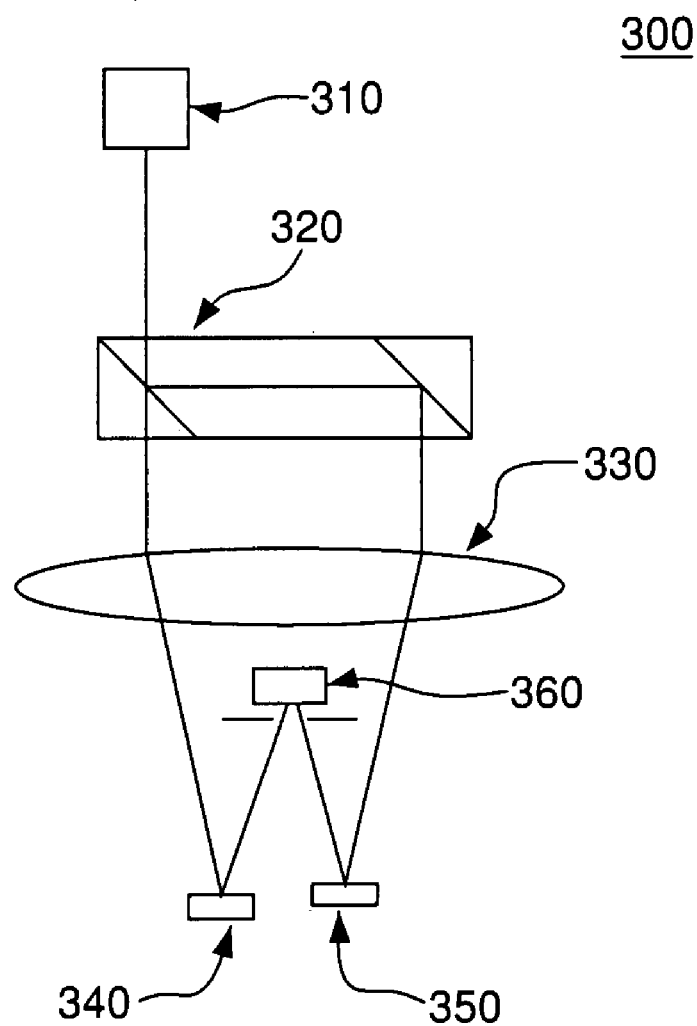
FIG. 3 illustrates a sensor according to an aspect of the present invention.

Referring now to FIG. 3, there is shown a sensor according to an aspect of the present invention. Sensor 300 may include a source 310, a beam splitter 320, a converger 330, a sensor MEMS 340, a reference MEMS 350 and a detector 360. As may be seen in FIG. 3, source 310 may be split into multiple beam paths by beam splitter 320. The multiple beam paths may be converged by converger 330. A first of the multiple beam paths may be incident on sensor MEMS 340 and a second beam path may be incident on reference MEMS. Each of the multiple beam paths may be incident on detector 360, such that variations in path length between the multiple beam paths may produce interference on detector 360.

Figure 4:
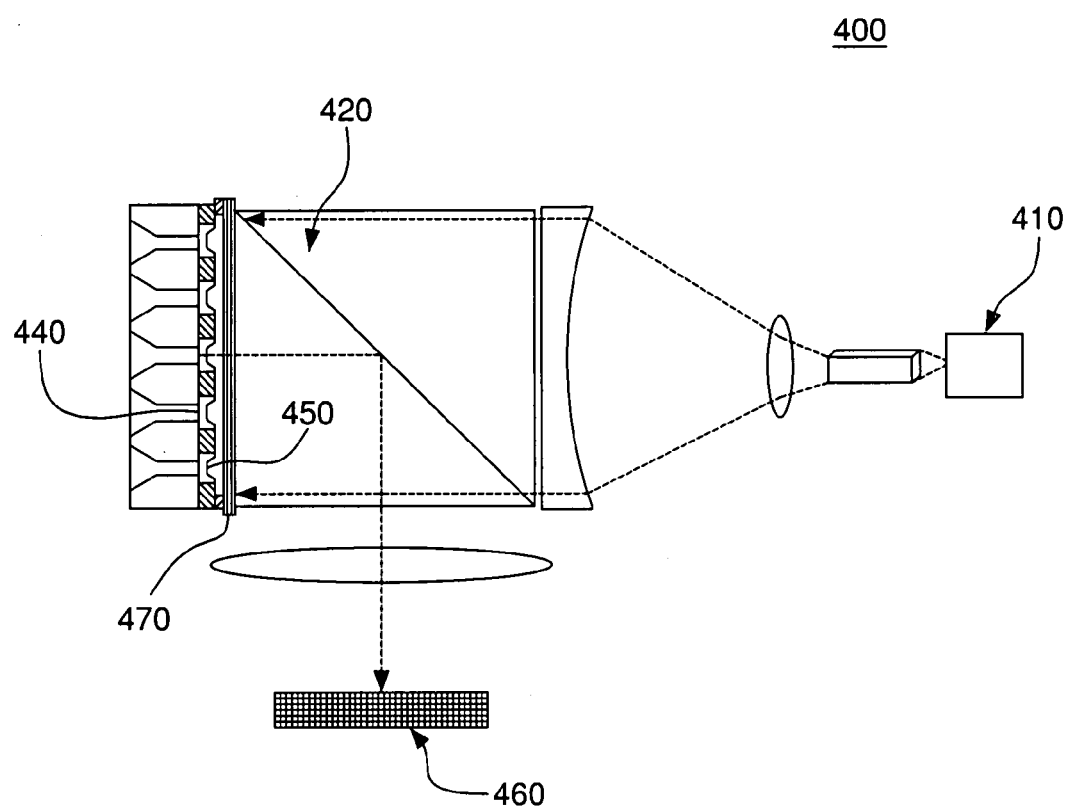
FIG. 4 illustrates an interferometric sensor utilizing the principle of a sensor according to an aspect of the present invention.

Referring now also to FIG. 4, where there is shown an interferometric sensor utilizing the principle of sensor 300 according to an aspect of the present invention. The present invention may utilize an array of MEMS 450 and common electrode 440, which are reflective and designed to change the optical path length between MEMS 450 and Fabry-Perot Interference stack 470 as well as an optical interferometer, such as a Fabry-Perot structure, for example. When an external electrical field is applied to MEMS 450, such as by receipt of an electromagnetic wave of the proper wavelength region, IvfEMS 450 receiving this signal may be deflected due to its proximity to a common electrode tat provides a fixed position charge field, As the potential of MEMS 450 changes, the charge differential between the element and the common electrode may vary, causing the element to change its spacing or position relative to the common electrode. A beam from source 410 may be expanded and collimated to uniformly illuminate MEMS receiving array including sensor MEMS 450 and optionally an additional reference MEMS. The beam may pass through a beam splitter 420 for providing separation of the incoming beam from the reflected beam returned from MEMS array. According to an aspect of the present invention, the beam may pass through the beam splitter and then through a Eabry-Perot interferometer stack, which may be designed as a double pass interferometer, The phase of the light reflected from the MEMS may create constructive or destructive interference and thereby create an intensity variation in the return beam that is representative of the position of reflective MEMS element 450, for example. As a MEMS element 450 moves with changes in the electrical charge received its position change may affect the optical phase in the interferometer and thereby change the intensity of the light in the return beam. Once calibrated without an incoming signal, the sensor may indicate deflection of the receiving element versus its reference position. The return beam with the intensity variation information from the received signal may be deflected by the beam splitter to either a photo sensor or to an optical imaging array 460. As each MEMS element changes its position based upon a received signal, the single photo sensor version may register an average change in the value of the array. The optical imaging array, such as a CCD, may provide an image of the output from the array, and with the use of the correct RF collection design may provide a visual image of the microwave image received by the MEMS array. In this manner the MEMS array may act as an imaging up-convefler for GHz and THz radiation.

The optional reference MEMS, may be shielded from the incoming RF signal and thereby act as a reference. In such a configuration, an additional drive may be added to the array elements that drive both the imaging MEMS elements and those that are acting as reference elements. The use of reference MEMS may allow the minimization of sensing artifacts such as may occur from changes in ambient conditions of the sensor, such as changes in temperature or humidity. With the addition of a reference oscillation, additional measurements may be made to determine the variation in frequency between the incoming signal and the reference oscillation and thereby provide the frequency of the received signal.

Figure 5:
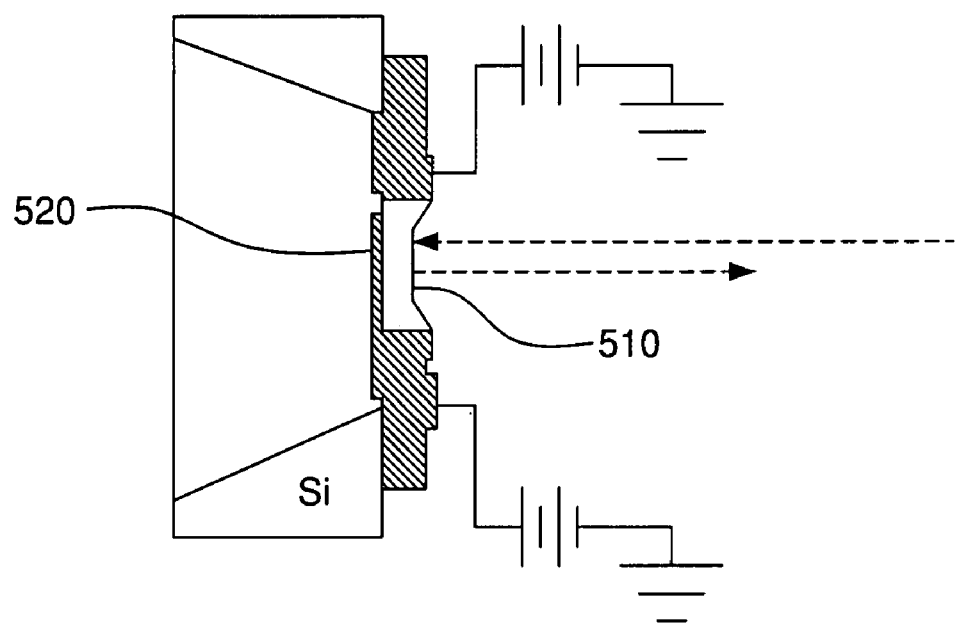
FIG. 5 illustrates a reflective electrode for use in a device according to an aspect of the present invention.
Figure 6:
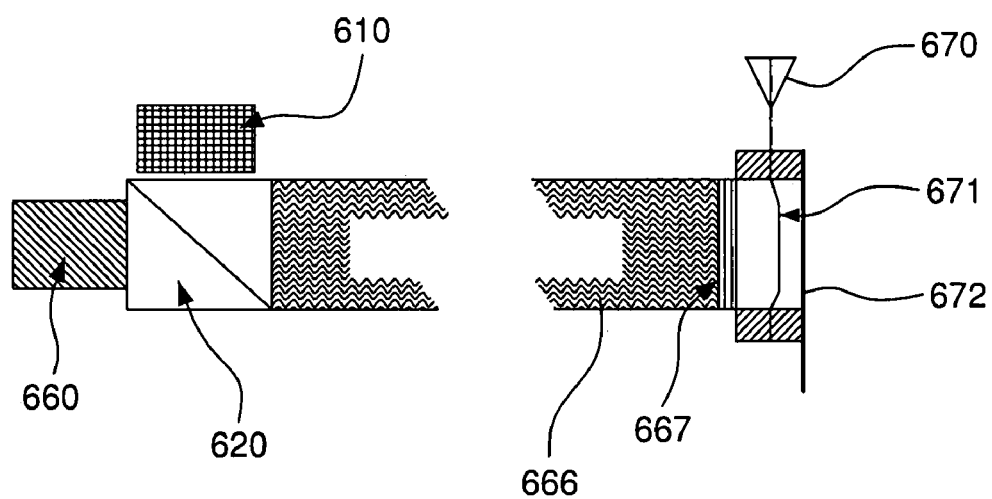
FIG. 6 illustrates an embodiment of the present invention utilizing an optical fiber based Fabry-Perot.

Referring now to FIG. 5, there is shown a reflective electrode 500 for use in a device according to an aspect of the present invention. As may be seen in FIG. 5, a MEMS 510 may be reflective and designed to move in a linear fashion when an external electrical field is applied to it via receipt of an electromagnetic wave of the proper wavelength region. MEMS 510 may be deflected due to its proximity to a common electrode that provides a static field on the element. As the potential of MEMS changes, the charge differential between the element and the common electrode 520 may vary, causing the element to change its spacing or position relative to the common electrode. MEMS 510 may be reflective and may move in a linear fashion so as to be the active element in an optical interferometer, for example. Referring now also to FIG. 6, there is shown an embodiment of the present invention utilizing an optical fiber based Fabry-Perot. A Fabry-Perot interferometer may be one type of interferometer that may be used, and may provide a linear pathway for the light to pass through and then reflect back from MEMS within the aperture of an optical fiber. Such a structure may allow the light from a source traveling through the optical fiber to reflect off of MEMS, and either constructively or destructively interfere as it passes back into the fiber. At the opposite end of the fiber the returning light may be separated and its intensity measured to determine if an RF signal has been received. FIG. 6 illustrates a photodetector and collector optics 660, beam splitter 620, light source 610, fiber optics 666, and stack of dielectric filters 667 (used to create a Fabry-Perot interferometer). Antenna 670 is directly connected to a MEMS membrane mirror 671 such that as the mirror oscillates back and forth, it will change the wavelength between the stack and the mirror and therefore the interferometer will vary between a bright reflection and black dependent on how the mirror moves and how the interferometer is bent. The wound plane 672 is for the antenna and MEMS to resonate against in terms of charge.

According to an aspect of the present invention, detection of extremely high frequency pulses in the 100's of GHz and THz frequencies may be achieved. Other attempts in the art to detect such signals include conversion of the signal to either thermal stress or optical interaction causing polarization changes in a laser beam. The technique described here utilizes MEMS elements to detect the received signal.

Figure 7:
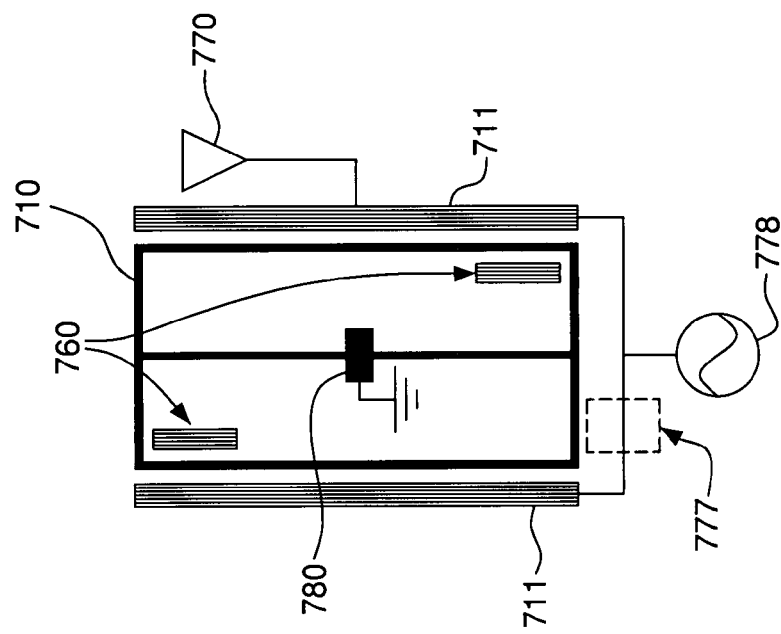
FIG. 7 illustrates a box MEMS sensor according to an aspect of the present invention.

Referring now to FIG. 7, there is shown a MEMS resonate resonating box sensor according to an aspect of the present invention. In this approach a MEMS may be placed in a balanced electrical field that is unbalanced by the received signal that is imposed on one side of the MEMS. The imbalance may cause MEMS to oscillate in a manner different to tat caused by oscillations in the drive source that provides the initial electrical field. This imbalanced oscillation may be detected with either electrical or optical means. FIG. 7 includes a box-type MEMS resonator 710 and anchor 780 connected to electrical ground. Sensing electrodes 760 sense the position of the MEMS resonator 710, drive electrodes 711 one of which is connected to antenna 770. Drive signal generator 778 produces a phase-shift delay 777 for driving MEMS into a known oscillation mode. When the antenna receives a signal, the phase will change and torque the MEMS resonate box.

More specifically, the resonating box operates in the 1 GHz frequency range and senses THz by having parallel signals at THz frequencies applied to both sides of the box. These pulses are simply square waves at a frequency near the desired detection wavelength. The box is the pat to ground for the incoming signal. In the first approach, since both sides of the box receive the same drive signal the box doesn't move. A received signal would then interact with the signal on one side of the box. This interaction will be either an increase in the magnitude of the signal when the two pulses are in phase, a decrease when they are out of phase or a beat frequency interaction resulting in a lower frequency oscillation than either of the two signals. In any of these cases, the potential field on the box on the side of that the incoming signal is applied is changed compared to the side where only the reference signal is applied. This change then causes the box to oscillate and that motion can then be detected via, for example, optical or electrical techniques. To maximize the S/N ratio (signal-to-noise) the sensor will also need a second box resonator to act as a comparator thus handling parasitic capacitance, thermal issues, vibration, etc.

Figure 8:
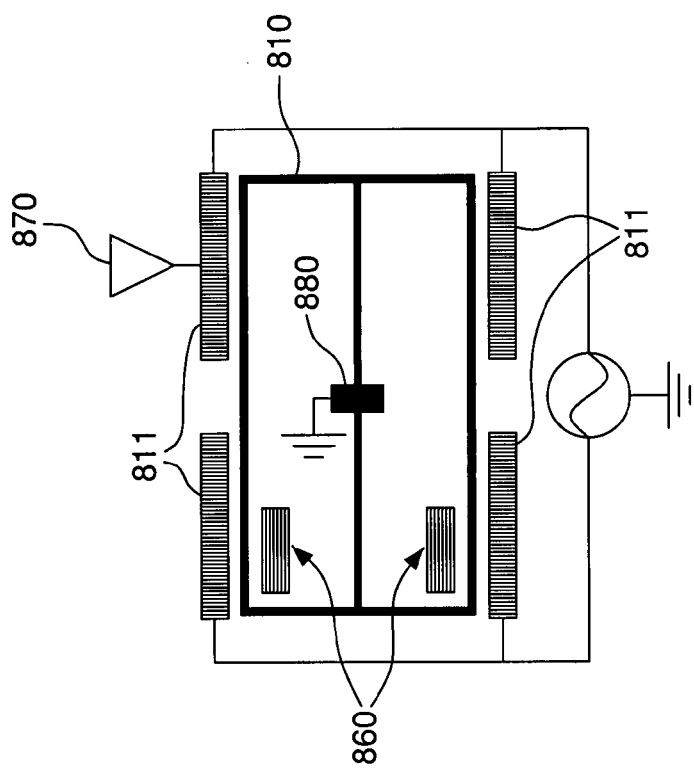
FIG. 8 illustrates an alternative box MEMS sensor according to an aspect of the present invention.

FIG. 8 illustrates antenna 870, MEMS resonator 810 and anchor 880 connected to electical ground. Sensing electrodes 860 sense the position of the MEMS resonator 810. FIG. 8 is similar to the device of FIG. 7 with two additional drive electrodes 811. This configuration produces a more rotational resonance around the anchor point 880 by torquing only one end of the MEMS resonator (i.e. rather than one side per FIG. 7). The phase-shift delay is included with in the FIGS. 8-10 embodiments but are not shown for simplicity purposes.

Figure 9:
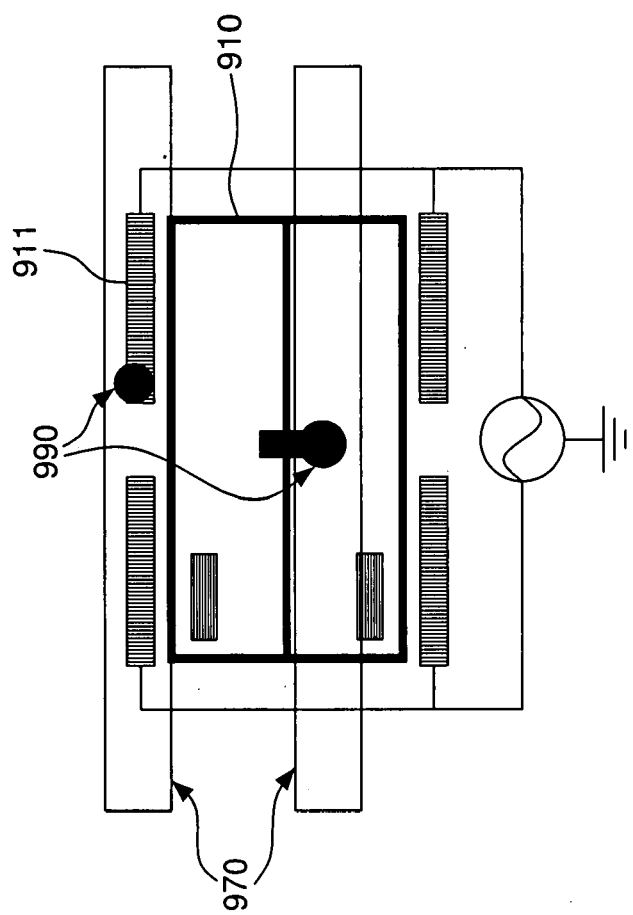
FIG. 9 illustrates another alternative box MEMS sensor according to an aspect of the present invention depicting contacts for the sensor of FIG. 8.

Referring now to FIG. 9, there is shown 2 dipole antenna elements 970 and contacts (e.g. in the form of gold contact pads) 990 for the sensor of FIG. 7. In particular, contact 990 is present between antenna and sensor. In particular, each dipole element is connected to a different part of the resonator. One dipole element is connected to one drive electrode 911 and the other dipole element is connected to the center of the MEMS resonator 910. Thus, the oscillation will be transferred to the MEMS device.

Figure 10:
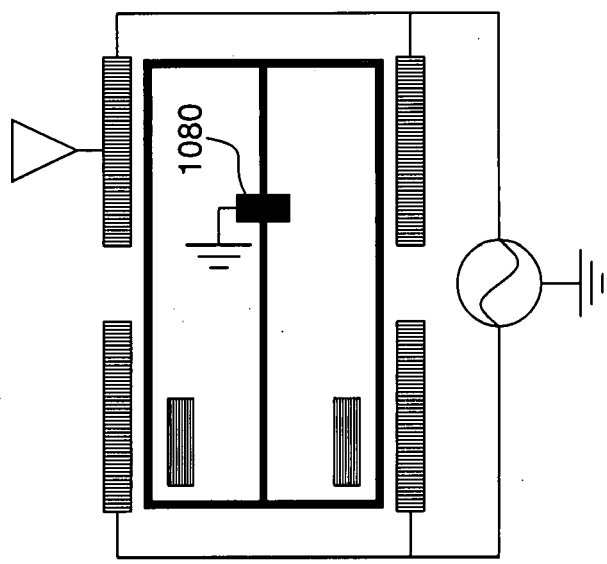
FIG. 10 illustrates a further alternative box MEMS sensor according to an aspect of the present invention depicting an offset anchor for the sensor of FIG. 8.

In FIG. 10, an offset anchor 1080 may optionally be provided to the sensor of FIG. 8 to provide mechanical gain of received signals by changing the point of torquing.

MEMS structures such as resonating box cantilevers or resonating comb structures may be used to oscillate at up to 1.6GHz, for example.

High frequency of oscillation may provide high speed detection of any imbalance in the charge applied to the MEMS. The present sensor design may incorporate MEMS with electrodes on either side of the resonating structure. In addition, the sensor may include a GHz or THz signal generator to provide a drive signal to both sides of the MEMS. With the phase and power applied to both sides substantially constant, MEMS may be balanced or in a stable oscillation. When a received signal of a frequency similar to the drive frequency is introduced on one side of MEMS, an interaction with the drive frequency may create either an increased potential on one side, when the signals are in phase, a decreased potential if the signals are out of phase, or a beat frequency interaction if the signals are not of the same frequency. In any event, the potential on the receiving side of MEMS may be changed, resulting in MEMS changing position or oscillation characteristics suitable for detection. Unlike typical MEMS sensors that utilize changes in mechanical properties, such as stress or weight, for detection, the present invention may drive the MEMS as a field strength sensor. The interaction between the incoming signal and MEMS may be based upon the change in electrical charge on either the MEMS or the associated electrodes.

Mechanical gain of the received signal may be achieved by injecting the received signal at one corner, or in another non-symmetrical manner, of a box MEMS such that a shaking oscillation may be created causing the opposite end of the box to move more. Such an effect may be accomplished by either having less or no drive energy on the opposite end, or by building the MEMS so that its mechanical leverage is designed to move the opposite end more, The MEMS may incorporate an antenna structure or a sensing material that produces a charge shift in the MEMS. Discharge of this electrical charge on the MEMS may be by an electrical circuit connecting the MEMS to a ground, or by a contact or MEMS switch that provides a discharge path between readings.

The interaction between the incoming signal and the MEMS may be enhanced by incorporating the MEMS as a component of a resonator where the selected frequency of the received signal may establish a standing wave resonance or may reflect within the structure. With MEMS structures it may be possible to design a variable wavelength resonator where the MEMS elements may be used to both sense the received signal and change the resonance frequency of the sensor. In such a configuration, the sensing element may be used to scan over a select frequency range.

Comb structures on the electrodes and the MEMS may enhance interactions between the two and may provide sensing by capacitive changes. Optical sensing may be used to provide sensing of MEMS movement and may provide a gain to the received signal.

The incorporation of two MEMS architectures to fabricate a heterodyne receiver may allow the system to both detect and minimize the noise level of detection. The fact that this sensor may operate in ambient environments, may be broadband or solid state, and may allow for use in applications where miniaturization is important, such as in portable sensors, scanning arrays and imaging starring arrays, for example.

FIG. 11 illustrates an exemplary photoelectric MEMS array sensor 1100 which includes a pixel array substrate 1101 which functions as an optical window. Photoelectric pixel array 1103 includes a plurality of photoelectric pixels 1102 (i.e. used to generate electricity) which are connected to the substrate 1101. A contact 1180 (made of, for example, gold bead—see FIG. 13) transmits the electrical charge generated in the photoelectric element to one of the two MEMS elements 1110, 1112 each having one end resting on the top surface of MEMS base 1109. A sensing MEMS element 1110 builds up a charge which bends the MEMS element toward the sensing electrode 1160, and a reference MEMS element 1112 is provided and similarly connected to a reference electrode 1162. FIG. 11 also includes drive electrode 1111 and base 1199 (made of, for example, silicon). Piezoelectric or magnetostrictive pixels may be used as an alternative type sensing element in place of the photoelectric pixels mentioned above.

FIG. 12 illustrates a plan view of the photoelectric pixel array 1103 used in FIG. 11.

FIG. 13 illustrates an enlarged plan view of the selected portion 13 in FIG. 11 (i.e. with the pixel array substrate and photoelectric pixel removed for simplicity purposes).

FIG. 14 illustrates an exemplary RF MEMS array sensor 1400. This particular sensor differs from the sensor of FIG. 11 in that an RF pixel array 1403 is being utilized in place of the photoelectric pixel array 1103 described above. The RF array 1403 includes a plurality of RF devices such as, for example, an H-shaped antenna pixels/dipoles 1402 as shown in FIGS. 14 and 15. FIG. 14 utilizes a plurality of waveguide apertures 1414 within substrate 1401 to direct the received signal to the individual RF anterna pixels 1402 within the RF array 1403.

FIG. 15 illustrates a plan view of the RF antenna pixel array 1403 used in FIG. 14.

FIG. 16 illustrates an enlarged plan view of the selected portion 16 in FIG. 14 (i.e. with the pixel array substrate and RF antenna pixel removed for simplicity purposes).

Staring RF arrays may be formed with the sensors described herein, with elements of the array designed to operate at different frequencies. Such a configuration may allow the array to perform the function of a wide bandwidth receiver with frequency specific elements distributed across the bandwidth of interest. In such a configuration the array need not be optimized to be an imaging array, but instead may provide spectral analysis of the scene within its view.

With the photoelectric pixel embodiments above, radiation of various types can be detected by designing the photoelectric pixels to interact with the radiation to produce electrons that change the charge of the sensing MEMS. Radiation types such as, for example, IR, visible light, UV, X-Rays, alpha, beta, gamma, and neutrons can be detected in this manner.

This sensor architecture provides the ability for a design separation between the element reacting to the external signal or stimulus and the MEMS element that is used to measure the reaction of the interacting element (photoelectric pixel for example). This provides the ability to maximize the performance of each of these component elements. For example a photo-electric pixel can be fabricated at any size or shape to provide the desired sensitivity and aperture, while the MEMS elements can be independently designed to provide the maximum sensitivity to the electrical signal produced by the photo-electric element. If the MEMS were required to be the same size as the photoelectric pixel it would not retain the ability to provide a high level of sensitivity to the electrical signal from the photoelectric pixel.

GHz and THz imaging arrays may be capable of providing images of obscured objects, such as those obscured under clothing or within packages, for example. With the use of imaging at specific frequencies or by using spectral scanning, it may be possible for the starring array to provide chemical analysis of the object in view. By using an appropriately designed dielectric surface, RF lenses may be formed to permit the starring array to become an RF camera and thereby allow the optical image created by this invention to be a true image of the scene at the RE frequency of its sensor design. Thus, a multi-band sensing device is provided by designing and/or optimizing portions of the array to be sensitive to different desired sensing regions. For example, each element of the array is slightly off-tuned from the previous element so as to provide a continuous spectrum broadband spectrometer. Other array architectures may be employed. For example, individual elements of the array can be tuned to specific emission frequencies of known chemicals or compounds such that when the pixels associated with that known chemical or compound become active, the array can signal the presence of that known chemical or compound. With the use of multiple type types of sensor materials such as millimeter wave and THz antennas, along with photoelectric pixels at various frequencies, a wide spectral range can be used to identify chemicals or compounds. Such a device would be considered to be hyperspectral.

For any of the above embodiments, generation of the THz reference signal can be done several ways, 2 examples of which are as follows:

1. Utilizing high speed clock circuits it is possible to generate pulses up to 10 GHz in frequency. By taking two of these clock signals and designing them to be out of phase and then taking the signals and passing those through a set or potentially adjustable delay line a slight shift in their phase can be achieved. When the two signals are combined the result is a cancellation of the signal except where the pulses match due to the delay set by the delay line. This then provides a series of pulses that can be set to be in the THz range. By combining multiple clocks of this nature, a continuous wave signal can be generated. Alternatively, utilizing resonate MEMS devices in a similar manner to generate pulses that are then combined and via phase shifting result in higher frequency pulses.
2. THz pulses can be generated by utilizing laser diodes to generate two light beams at two different frequencies and then integrating the two beams within crystals like ZnTe, GaP, or specially designed polymer stacks. The beat frequency between the two beams can be set to be in the THz range and the crystal or polymer material converts the optical signal into a THz output.

This application can be used to sense sources of emission such as a biohazard (e.g. nuclear or magnetic radiation). The sensor can function as part of a spectroscopic detector (e.g.

whether in an emission, absorption, or transmission context). The sensor can also function as a switch that is actuated upon selective exposure to desired wavelengths.

Those of ordinary skill in the art will recognize that many modifications and variations of the present invention may be implemented without departing from the spirit or scope of the invention. Thus, it is intended that the present invention cover the modification and variations of this invention provided they come within the scope of the appended claims and their equivalents.

What is claimed is:

1. A sensor that senses incident energy, the sensor comprising:
   a receiver capable of receiving incident energy;
   a first MEMS, wherein a first portion of the first MEMS is electrically coupled to the receiver and is electrically coupled to a first reference signal, wherein a second portion of the first MEMS is driven by a first reference frequency corresponding to the first reference signal, wherein a first actual frequency and a first actual magnitude of oscillation of the second portion of the first MEMS is determined by an interaction of mechanical properties of the first MEMS and the first reference frequency, wherein the second portion of the first MEMS oscillates at the first actual frequency and the first actual magnitude when the received incident energy is below a first predetermined threshold, and wherein the second portion of the first MEMS oscillates at a second actual frequency and a second actual magnitude when the received incident energy is above a second predetermined threshold;
   a second MEMS, wherein a first portion of the second MEMS is electrically coupled to a second reference signal and substantially isolated from the received incident energy, wherein a second portion of the second MEMS is driven by a second reference frequency corresponding to the second reference signal, wherein a third actual frequency and a third actual magnitude of oscillation of the second portion of the second MEMS is determined by an interaction of mechanical properties of the second MEMS and the second reference frequency, wherein the second portion of the second MEMS oscillates at the third actual frequency and the third actual magnitude; and
   a detection system including a first sensing electrode associated with the second portion of the first MEMS, and a second sensing electrode associated with the second portion of the second MEMS, wherein the third actual frequency and the third actual magnitude is compared with either both the first actual frequency and the first actual magnitude or both the second actual frequency and the second actual magnitude to thereby determine the received incident energy, wherein the first MEMS and the second MEMS are exposed to common environmental conditions, and wherein the comparison that determines the received incident energy substantially eliminates any affect of the common environmental conditions.

2. The sensor of claim 1, wherein the second reference frequency is substantially equal to the first reference frequency.

3. The sensor of claim 1, wherein the first actual frequency is substantially different from the third actual frequency.

4. The sensor of claim 1, wherein the second actual frequency is a natural resonance frequency or harmonic thereof of the second portion of the first MEMS, wherein the received incident energy and the first reference signal are applied to the first MEMS at different frequencies, wherein a combination of the different frequencies generate a beat frequency which corresponds to the natural resonance frequency or the harmonic thereof of the second portion of the first MEMS.

5. The sensor of claim 4, wherein the second actual frequency of the second portion of the first MEMS is a lower frequency than the frequency of the received incident energy.

6. The sensor of claim 1, wherein the detection system further uses a phase difference between the third actual frequency and either the first actual frequency or the second actual frequency to determine the received incident energy.

7. The sensor of claim 1, wherein the first reference signal and the second reference signal include a direct current bias voltage.

8. The sensor of claim 1, wherein the first predetermined threshold is substantially equal to the second predetermined threshold.

9. The sensor of claim 1, wherein the first predetermined threshold is zero.

10. The sensor of claim 1 further comprising an electrode associated with each of the first and second MEMS which provide electrical fields to the first and second MEMS, respectively.

11. The sensor of claim 10, wherein the electrical fields correspond to direct currents.

12. The sensor of claim 10, wherein the electrical fields correspond to waveforms.

13. The sensor of claim 10, wherein the oscillation of the first and the second MEMS create a change in capacitance between the first MEMS and corresponding electrode, and a change in capacitance between the second MEMS and corresponding electrode.

14. The sensor of claim 10, wherein the oscillations of the first and second MEMS generate a transfer of electrical charge to each corresponding electrode from the respective first MEMS or the second MEMS.

15. The sensor of claim 1, wherein the first MEMS and the second MEMS are cantilevers.

16. The sensor of claim 1, wherein the receiver is an antenna.

17. The sensor of claim 1, wherein the incident energy is electromagnetic radiation.

18. The sensor of claim 1, wherein the incident energy is in the gigahertz range.

19. The sensor of claim 1, wherein the incident energy is in the terahertz range.

20. The sensor of claim 1, wherein the incident energy is IR radiation.

21. The sensor of claim 1, wherein the incident energy is visible light radiation.

22. The sensor of claim 1, wherein the incident energy is UV radiation.

23. The sensor of claim 1, wherein the incident energy is X-Ray radiation.

24. The sensor of claim 1, wherein the incident energy is alpha radiation.

25. The sensor of claim 1, wherein the incident energy is beta radiation.

26. The sensor of claim 1, wherein the incident energy is gamma radiation.

27. The sensor of claim 1, wherein the incident energy is neutron radiation.

28. The sensor of claim 1, wherein the incident energy is nuclear radiation.

29. The sensor of claim 1, wherein the incident energy is magnetic radiation.

30. The sensor of claim 1, wherein the receiver comprises a photodiode.

31. An array of the sensors of claim 1, wherein each of the sensors has a corresponding photoelectric pixel electrically connected to a corresponding one of the first MEMS, wherein the photoelectric pixels convert the received incident energy into electricity.

32. An array of the sensors of claim 1, wherein each of the sensors has a corresponding piezoelectric pixel electrically connected to a corresponding one of the first MEMS, wherein the piezoelectric pixels convert the received incident energy into electricity.

33. An array of the sensors of claim 1, wherein each of the sensors has a corresponding magnetostrictive pixel electrically connected to a corresponding one of the first MEMS, wherein the magnetostrictive pixels convert the received incident energy into electricity.

34. An array of the sensors of claim 1, wherein each of the sensors has a corresponding antenna pixel electrically connected to a corresponding one of the first MEMS, wherein the antenna pixels receive the incident energy such that antenna signals corresponding to the received incident energy is transmitted to the first MEMS.

35. An array of the sensors of claim 34, wherein each antenna pixel is h-shaped.

36. An array of the sensors of claim 31, wherein each sensor within the array of sensors is able to detect a different frequency of the incident energy from that of another sensor within the array of sensors.

37. An array of the sensors of claim 32, wherein each sensor within the array of sensors is able to detect a different frequency of the incident energy from that of another sensor within the array of sensors.

38. An array of the sensors of claim 33, wherein each sensor within the array of sensors is able to detect a different frequency of the incident energy from that of another sensor within the array of sensors.

39. An array of the sensors of claim 34, wherein each sensor within the array of sensors is able to detect a different frequency of the incident energy from that of another sensor within the array of sensors.

40. An may of the sensors of claim 1, wherein an output of the array of sensors is capable of producing an image corresponding to the received incident energy.

41. An may of the sensors of claim 1, wherein an output of the array of sensors is capable of producing a spectral analysis corresponding to the received incident energy.

42. An array of the sensors of claim 1, wherein a plurality of adjacent sensors within the array of sensors is designed to detect a predetermined received incident energy.

* * * * *